(12) United States Patent
Matsubara (10) Patent No.: US 6,469,391 B2
(45) Date of Patent: Oct. 22, 2002

(54) SEMICONDUCTOR DEVICE HAVING SILICON OXIDE SIDEWALLS

(75) Inventor: Naoteru Matsubara, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/747,974

(22) Filed: Dec. 27, 2000

(65) Prior Publication Data

US 2001/0005627 A1 Jun. 28, 2001

(30) Foreign Application Priority Data

Dec. 27, 1999 (JP) ........................................... 11-371636
Dec. 4, 2000 (JP) ........................................ 2000-367886

(51) Int. Cl.[7] ......................... H01L 23/535; H01L 23/52
(52) U.S. Cl. ...................................... 257/774; 257/758
(58) Field of Search ................................ 257/751, 758, 257/774

(56) References Cited

U.S. PATENT DOCUMENTS 5,728,595 A * 3/1998 Fukase ....................... 438/241
6,028,015 A * 2/2000 Wang et al. ................ 257/607
6,150,723 A * 11/2000 Harper et al. ............... 257/751
2001/0045658 A1 * 11/2001 Deboer et al. .............. 257/758

FOREIGN PATENT DOCUMENTS

JP       10154801 A  *  6/1998  ......... H01L/27/108

* cited by examiner

*Primary Examiner*—Allan R. Wilson
(74) *Attorney, Agent, or Firm*—McDermott, Will & Emery (57) ABSTRACT

A semiconductor device capable of preventing a conductive member embedded in an interlayer dielectric film from oxidation or corrosion and keeping the electric characteristics of the conductive member excellent is obtained. The semiconductor device comprises the interlayer dielectric film, the conductive member embedded in the interlayer dielectric film and side wall insulator films formed on the side surfaces of the conductive member. Thus, the side wall insulator films inhibit moisture and hydroxyl groups contained in the interlayer dielectric film from reaching the conductive member. Therefore, the conductive member is prevented from inconvenience such as oxidation or corrosion resulting from moisture and hydroxyl groups discharged from the interlayer dielectric film. Consequently, the electric characteristics of a contact part can be maintained excellent.

7 Claims, 13 Drawing Sheets

SEMICONDUCTOR DEVICE HAVING SILICON OXIDE SIDEWALLS

BACKGROUND OF THE INVENTION

1. Field of the Invention

The present invention relates to a semiconductor device and a method of fabricating the same, and more particularly, it relates to a semiconductor device having an interlayer dielectric film and a method of fabricating the same.

2. Description of the Prior Art

In recent years, wires must be refined and multi-layered in order to further increase the degree of integration of a semiconductor integrated circuit. In order to multi-layer the wires, an interlayer dielectric film is provided between the wires. If the surface of the interlayer dielectric film is not flat, steps result in the wires formed on the interlayer dielectric film. Thus, the wires may disadvantageously be disconnected.

Therefore, the surface of the interlayer dielectric film (i.e., the surface of a device) must be rendered as flat as possible. The technique of flattening the surface of the device, referred to as planarization, is increasingly becoming important following refinement and multi-layering of the wires in recent years. An organic SOG (spin on glass) film is known as an interlayer dielectric film frequently employed in planarization. In particular, planarization utilizing flowability of an interlayer dielectric film material is actively developed in recent years.

In order to form the organic SOG film, a solution prepared by dissolving a silicon compound in an organic solvent is dripped on a substrate while rotating the substrate. Thus, a coating of the solution is formed thickly on concave portions of steps defined on the substrate by wires and thinly on convex portions thereof, to relax the steps. Consequently, the surface of the coating of the solution is flattened.

Figure 26:
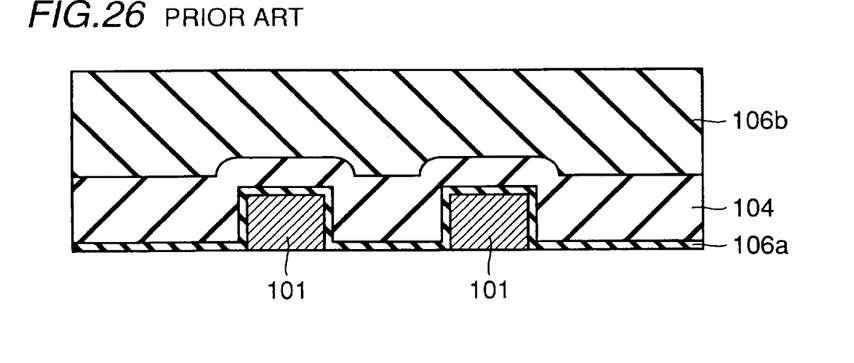
FIGS. 26 and 27 are schematic sectional views showing a multilevel interconnection forming process for a conventional semiconductor device.
Figure 27:
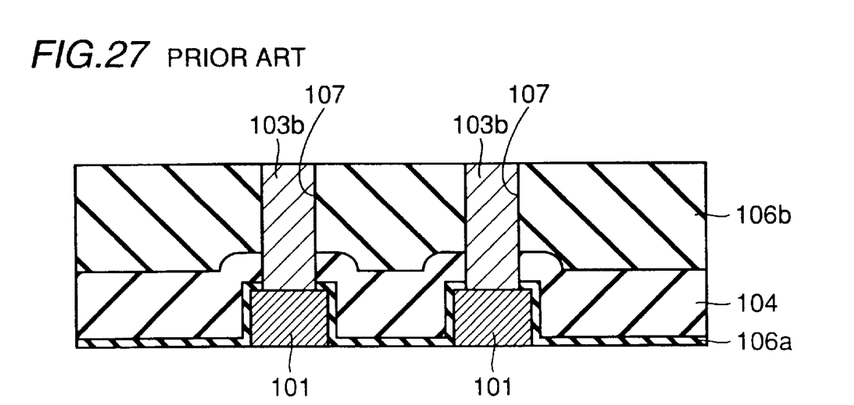

FIGS. 26 and 27 are schematic sectional views for illustrating a process of forming multilevel interconnections of a conventional semiconductor device. A conventional method of forming multilevel interconnections with an interlayer dielectric film of an organic SOG film is now described with reference to FIGS. 26 and 27. First, lower wires 101 are first formed, followed by deposition of a silicon oxide film 106a, an organic SOG film 104 and a silicon oxide film 106b, as shown in FIG. 26. The silicon oxide film 106b is flattened by CMP (chemical mechanical polishing).

Then, contact holes 107 reaching the upper surfaces of the lower wires 101 are formed in the silicon oxide film 106a, the organic SOG film 104 and the silicon oxide film 106b by general photolithography and anisotropic etching, as shown in FIG. 27. A metal material such as tungsten (W), copper (Cu) or aluminum (Al) is formed in the contact holes 107 and on the silicon oxide film 106b and part of the metal material located on the silicon oxide film 106b is thereafter removed by CMP or etch back, thereby forming contact plugs 103b. Thus, multilevel interconnections having excellent flatness can be formed by employing the organic SOG film 104 as part of an interlayer dielectric film.

When employing the organic SOG film 104 as the interlayer dielectric film, however, the contact plugs 103b are disadvantageously oxidized or corroded due to moisture and hydroxyl groups discharged from the organic SOG film 104. Consequently, the electric characteristics of the contact plugs 103b are disadvantageously deteriorated.

Further, the organic SOG film 104 discharges gas of moisture etc. into the contact holes 107 when forming the contact plugs 103b, to increase the pressures in the contact holes 107. Thus, flowability of the contact plugs 103b is deteriorated to disadvantageously result in defective embedding of the contact plug 103b. Consequently, the electric characteristics of the contact plugs 103b are disadvantageously reduced.

SUMMARY OF THE INVENTION

An object of the present invention is to provide a semiconductor device capable of preventing a contact plug (conductive member) embedded in an interlayer dielectric film from oxidation and corrosion and keeping the electric characteristics of the conductive member excellent.

Another object of the present invention is to provide a method of fabricating a semiconductor device without discharging gas of moisture etc. into a contact hole (opening) when embedding a conductive member in an interlayer dielectric film.

A semiconductor device according to an aspect of the present invention comprises an interlayer dielectric film, a conductive member embedded in the interlayer dielectric film and a side wall insulator film formed on the side surface of the conductive member.

In the semiconductor device according to the aforementioned aspect, the side wall insulator film formed on the side surface of the conductive member inhibits moisture and hydroxyl groups contained in the interlayer dielectric film from reaching the conductive member. Thus, the conductive member can be prevented from inconvenience such as oxidation or corrosion resulting from moisture and hydroxyl groups discharged from the interlayer dielectric film. Consequently, the electric characteristics of a contact part can be kept excellent.

In the semiconductor device according to the aforementioned aspect, the side wall insulator film preferably contains a material having a function of intercepting moisture and hydroxyl groups. Thus, the side wall insulator film can readily intercept moisture and hydroxyl groups.

In this case, the side wall insulator film preferably includes at least either a silicon oxide film or a silicon nitride film. In this case, further, the silicon oxide film preferably includes a silicon oxide film containing phosphorus and boron added thereto. Thus, the process time for forming the side wall insulator film can be reduced due to the high etching rate of the silicon oxide film containing phosphorus and boron added thereto. Further, the amount of the upper surface of the conductive member as scraped can be reduced due to reduction of the process time for forming the side wall insulator film.

In the semiconductor device according to the aforementioned aspect, the interlayer dielectric film preferably includes an SOG film. Thus, the interlayer dielectric film can be formed with excellent flatness.

In the semiconductor device according to the aforementioned aspect, the interlayer dielectric film preferably includes a coating film containing at least 1 mass % of carbon. When the interlayer dielectric film contains carbon, the mechanical strength of the interlayer dielectric film can be improved. Further, the dielectric constant of the interlayer dielectric film can be reduced. Consequently, parasitic capacitance between multiple wiring layers arranged through the interlayer dielectric film can be reduced.

In the semiconductor device according to the aforementioned aspect, an impurity is preferably introduced into the surface of the interlayer dielectric film. Thus, the portion of the interlayer dielectric film containing the introduced impurity is further improved in mechanical strength, to be capable of preventing a wafer crack resulting from a crack of the interlayer dielectric film caused in a step of polishing the interlayer dielectric film. Further, the portion of the interlayer dielectric film containing the introduced impurity is improved in wettability, to be capable of preventing the surface of the interlayer dielectric film from scratches caused in the step of polishing the interlayer dielectric film.

In the semiconductor device according to the aforementioned aspect, the interlayer dielectric film is preferably formed between a first conductive layer and a second conductive layer, and the first conductive layer and the second conductive layer are preferably electrically connected with each other through the conductive member embedded in the interlayer dielectric film. In this case, the second conductive layer may be formed on the upper surface of the interlayer dielectric film to be in contact with the conductive member. Further, the interlayer dielectric film may include a wiring groove formed on the upper portion of the conductive member, and the second conductive layer may be embedded in the wring groove to be in contact with the conductive member.

A method of fabricating a semiconductor device according to another aspect of the present invention comprises steps of forming a dummy interlayer dielectric film on a first conductive layer, forming an opening in the dummy interlayer dielectric film, forming a conductive member in the opening, etching back the dummy interlayer dielectric film, forming an interlayer dielectric film to cover the conductive member and forming a second conductive layer on the interlayer dielectric film to be in contact with the conductive member.

In the method of fabricating a semiconductor device according to the aforementioned aspect, the conductive member is formed with the dummy interlayer dielectric film before forming the interlayer dielectric film, to require neither a step of performing etching for forming an opening in the interlayer dielectric film nor a step of charging and embedding the conductive member in the opening of the interlayer dielectric film. Consequently, the electric characteristics of a contact part can be improved also when preparing the interlayer dielectric film from a material hard to etch or a material discharging a large quantity of moisture etc. in formation of the conductive member.

In the method of fabricating a semiconductor device according to the aforementioned aspect, the dummy interlayer dielectric film preferably includes a silicon oxide film containing phosphorus and boron added thereto. Thus, the process time for forming the side wall insulator film can be reduced due to the high etching rate of the silicon oxide film containing phosphorus and boron added thereto. Further, the amount of the upper surface of the conductive member as scraped can be reduced due to reduction of the process time for forming the side wall insulator film.

In the method of fabricating a semiconductor device according to the aforementioned aspect, the dummy interlayer dielectric film preferably contains a material having a function of intercepting moisture and hydroxyl groups. Thus, the side wall insulator formed by etching back the dummy interlayer dielectric film can readily intercept moisture and hydroxyl groups. In this case, the dummy interlayer dielectric film preferably includes at least either a silicon oxide film or a silicon nitride film.

In the method of fabricating a semiconductor device according to the aforementioned aspect, the step of forming the interlayer dielectric film preferably includes a step of forming the interlayer dielectric film by rotational coating. Thus, the conductive member can be completely embedded without causing voids (cavities).

In the method of fabricating a semiconductor device according to the aforementioned aspect, the step of etching back the dummy interlayer dielectric film preferably includes a step of forming a side wall insulator film on the side surface of the conductive member by etching back the dummy interlayer dielectric film. In this case, the side wall insulator film can inhibit moisture and hydroxyl groups contained in the interlayer dielectric film from reaching the conductive member. Thus, the conductive member can be prevented from inconvenience such as oxidation or corrosion resulting from moisture and hydroxyl groups discharged from the interlayer dielectric film. Consequently, the electric characteristics of a contact part can be kept excellent.

The method of fabricating a semiconductor device according to the aforementioned aspect preferably further comprises a step of ion-implanting an impurity into the interlayer dielectric film. Thus, the portion of the interlayer dielectric film containing the introduced impurity is further improved in mechanical strength, to be capable of preventing a wafer crack resulting from a crack of the interlayer dielectric film caused in a step of polishing the interlayer dielectric film. Further, the portion of the interlayer dielectric film containing the introduced impurity is improved in wettability, to be capable of preventing the surface of the interlayer dielectric film from scratches caused in the step of polishing the interlayer dielectric film.

A method of fabricating a semiconductor device according to still another aspect of the present invention comprises steps of forming a dummy interlayer dielectric film on a first conductive layer, forming an opening in the dummy interlayer dielectric film, forming a conductive member in the opening, etching back the dummy interlayer dielectric film, forming an interlayer dielectric film to cover the conductive member, forming a wiring groove reaching the conductive member in the interlayer dielectric film and embedding a second conductive layer in the wiring groove to be in contact with the conductive member.

In the method of fabricating a semiconductor device according to the aforementioned aspect, the conductive member is formed with the dummy interlayer dielectric film before forming the interlayer dielectric film, to require neither a step of performing etching for forming an opening in the interlayer dielectric film nor a step of charging and embedding the conductive member in the opening of the interlayer dielectric film. Consequently, the electric characteristics of a contact part can be improved also when preparing the interlayer dielectric film from a material discharging a large quantity of gas of moisture etc. in formation of the conductive member.

In the method of fabricating a semiconductor device according to the aforementioned aspect, the dummy interlayer dielectric film preferably includes a silicon oxide film containing phosphorus and boron added thereto. Thus, the process time for forming the side wall insulator film can be reduced due to the high etching rate of the silicon oxide film containing phosphorus and boron added thereto. Further, the amount of the upper surface of the conductive member as scraped can be reduced due to reduction of the process time for forming the side wall insulator film.

In the method of fabricating a semiconductor device according to the aforementioned aspect, the dummy interlayer dielectric film preferably contains a material having a function of intercepting moisture and hydroxyl groups. Thus, moisture and hydroxyl groups can be readily intercepted. In this case, the dummy interlayer dielectric film preferably includes at least either a silicon oxide film or a silicon nitride film.

In the method of fabricating a semiconductor device according to the aforementioned aspect, the step of embedding the second conductive layer in the wiring groove preferably includes a step of depositing the second conductive layer to be embedded in the wiring groove and thereafter removing an excessive deposited portion by polishing. Thus, the method includes no step of etching the second conductive layer, whereby the second conductive layer can be prepared from a material hard to etch.

In the method of fabricating a semiconductor device according to the aforementioned aspect, the step of forming the interlayer dielectric film preferably includes a step of forming the interlayer dielectric film by rotational coating. Thus, the conductive member can be completely embedded without causing voids (cavities)

In the method of fabricating a semiconductor device according to the aforementioned aspect, the step of etching back the dummy interlayer dielectric film preferably includes a step of forming a side wall insulator film on the side surface of the conductive member by etching back the dummy interlayer dielectric film. In this case, the side wall insulator film can prevent moisture and hydroxyl groups contained in the interlayer dielectric film from reaching the conductive member. Thus, the conductive member can be prevented from inconvenience such as oxidation or corrosion resulting from moisture and hydroxyl groups discharged from the interlayer dielectric film. Consequently, the electric characteristics of a contact part can be kept excellent.

The method of fabricating a semiconductor device according to the aforementioned aspect preferably further comprises a step of ion-implanting an impurity into the interlayer dielectric film. Thus, the portion of the interlayer dielectric film containing the introduced impurity is further improved in mechanical strength, to be capable of preventing a wafer crack resulting from a crack of the interlayer dielectric film caused in a step of polishing the interlayer dielectric film. Further, the portion of the interlayer dielectric film containing the introduced impurity is improved in wettability, to be capable of preventing the surface of the interlayer dielectric film from scratches caused in the step of polishing the interlayer dielectric film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings

First Embodiment

The structure of a semiconductor device according to a first embodiment of the present invention is now described with reference to FIG. 1. In the semiconductor device according to the first embodiment, an insulator film $2b$ is formed between adjacent lower wires 1. An organic SOG film 4 is formed on the lower wires 1 and the insulator film $2b$. A modified SOG film $4a$ modified by ion implantation is formed on the surface of the organic SOG film 4. Upper wires 5 are formed on the modified SOG film $4g$. Contact plugs (via plugs) $3b$ embedded in the organic SOG film 4 and the modified SOG film $4a$ connect the lower wires 1 and the upper wires 5 with each other.

According to the first embodiment, side wall insulator films $2a$ are formed on the side surfaces of the contact plugs $3b$ connecting the lower wires 1 and the upper wires 5 with each other. The side wall insulator films $2a$ are made of a material having a function of intercepting moisture and hydroxyl groups. According to the first embodiment, the side wall insulator films $2a$ are formed by silicon oxide films formed by plasma CVD.

According to the first embodiment, moisture and hydroxyl groups contained in the organic SOG film 4 can be prevented from penetrating into the contact plugs $3b$ by forming the side wall insulator films $2a$ having the function of intercepting moisture and hydroxyl groups on the side surfaces of the contact plugs $3b$ as hereinabove described. Consequently, the electric characteristics of the contact plugs $3b$ can be kept excellent.

A fabrication process for the semiconductor device according to the first embodiment is now described with reference to FIGS. 1 to 12.

Figure 2:
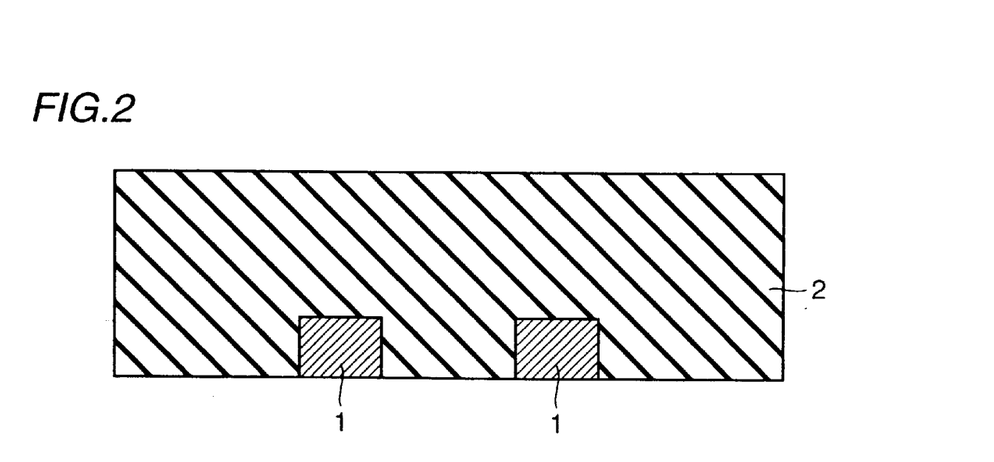
FIGS. 2 to 12 are schematic sectional views showing a multilevel interconnection forming process for the semiconductor device according to the first embodiment of the present invention.

Step 1 (See FIG. 2)

A dummy interlayer dielectric film 2 is formed by plasma CVD (chemical vapor deposition), to cover the lower wires 1. According to the first embodiment, an NSG (non-doped silicate glass) film, which is a non-doped silicon oxide film, is employed as the dummy interlayer dielectric film 2. This NSG film is formed under conditions of gas of TEOS (tetraethoxysilane) and oxygen ($O_2$), a TEOS gas flow rate of 500 sccm, an $O_2$ gas flow rate of 700 sccm, a temperature of 360° C., a pressure of 670 Pa and RF outputs of 80 W (13.56 MHz) and 85 W (450 kHz). Then, the formed dummy interlayer dielectric film 2 is flattened by CMP.

Figure 3:
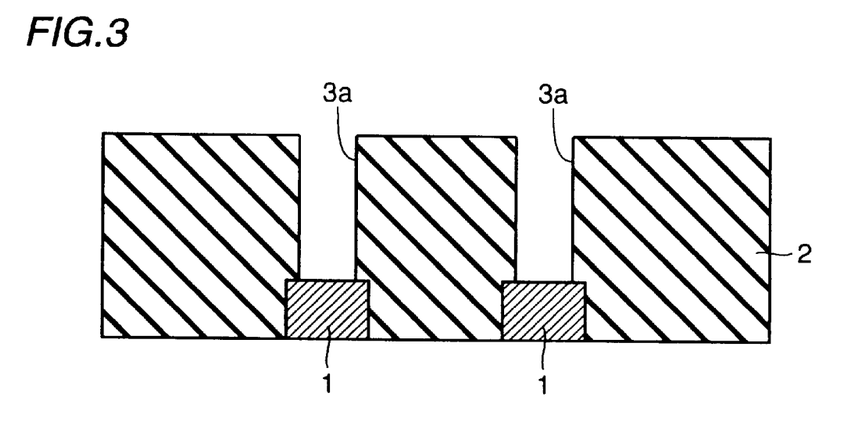

Step 2 (See FIG. 3)

Contact holes $3a$ are formed in the dummy interlayer dielectric film 2 by general photolithography and anisotropic etching.

Figure 4:
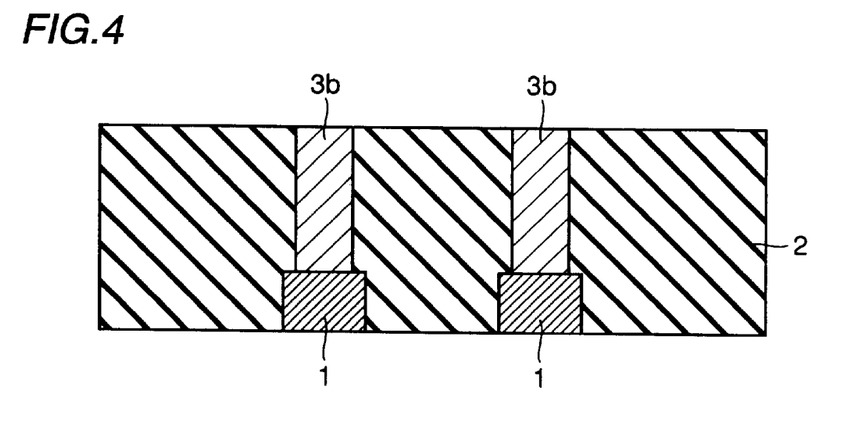

Step 3 (See FIG. 4)

Films of titanium (Ti), titanium nitride (TiN) and tungsten (W) are successively formed in the contact holes 3a and on the dummy interlayer dielectric film 2 by sputtering, CVD and blanket tungsten CVD respectively. An excessive deposited portion located on the dummy interlayer dielectric film 2 is polished by CMP to expose the dummy interlayer dielectric film 2. Thus, the contact plugs 3b are formed in the contact holes 3a.

Step 4 (See FIGS. 5 to 9)

The dummy interlayer dielectric film 2 is etched (etched back) by anisotropic etching through RIE (reactive ion etching). The etching process for the dummy interlayer dielectric film 2 is now described stepwise.

Figure 5:
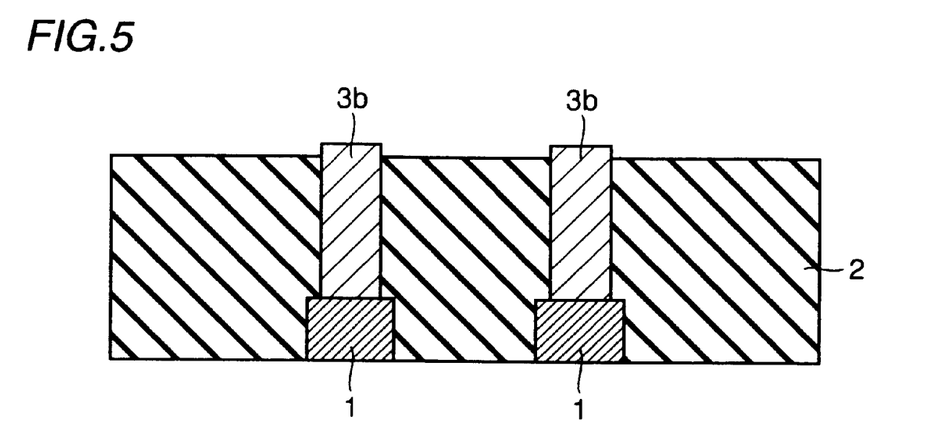

Etching is performed with a gas mixture of $CHF_3$, $CF_4$, Ar and the like under conditions of a temperature of $-10°$ C., a pressure of 26 Pa and an RF output (13.56 MHz) of 800 W. Immediately after starting etching, ions are perpendicularly introduced into the dummy interlayer dielectric film 2 and hence etching perpendicularly progresses, as shown in FIG. 5.

Figure 6:
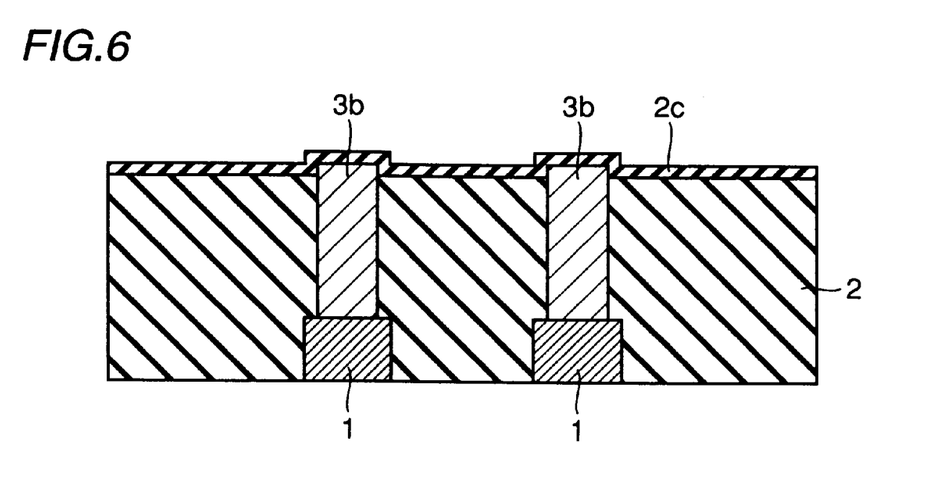

Fluorocarbon (CF) is deposited on the upper surfaces of the dummy interlayer dielectric film 2 and the contact plugs 3b due to the etching, as shown in FIG. 6. Thus, a deposition film 2c is defined.

Figure 7:
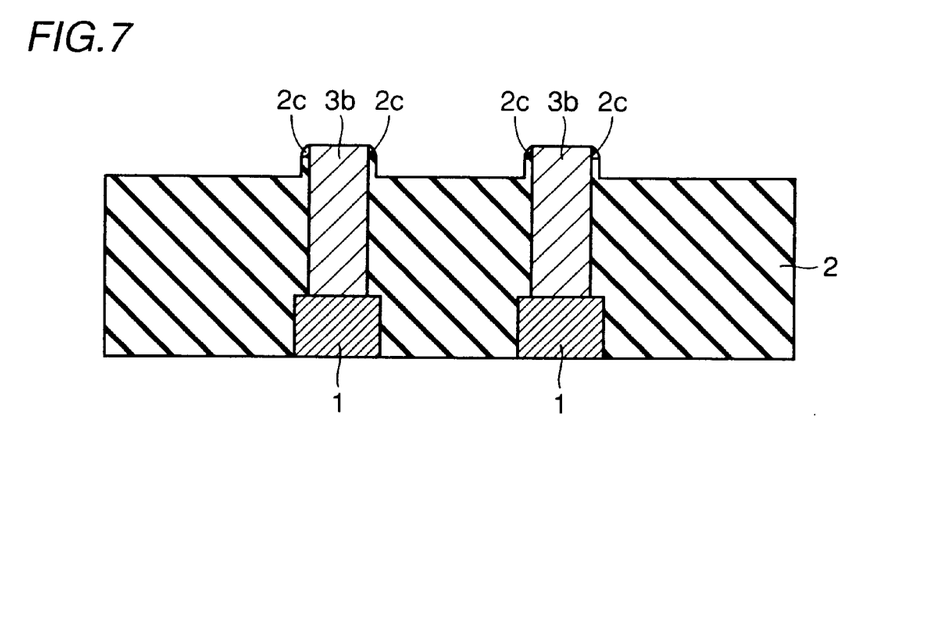
Figure 8:
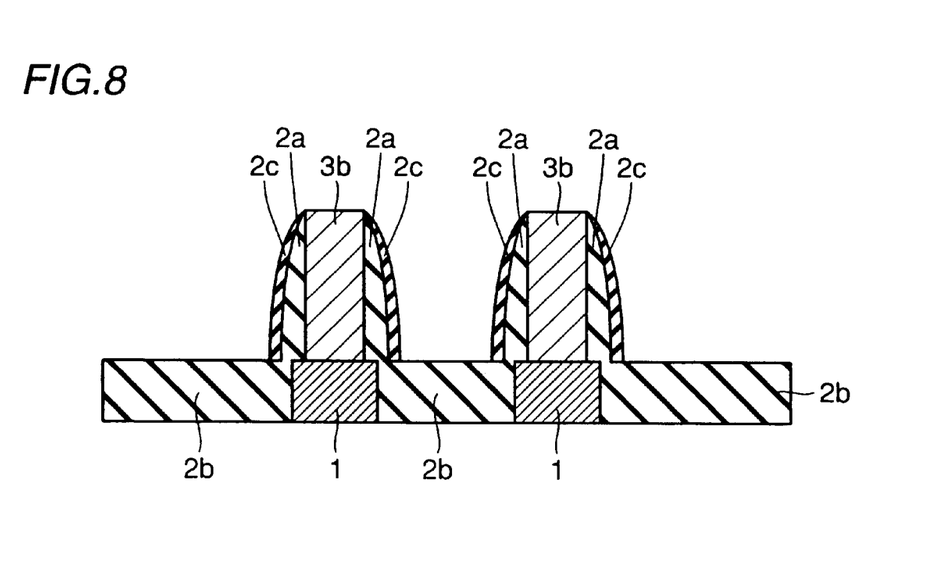

When etching is performed from above the deposition film 2c of fluorocarbon, parts of the deposition film 2c are removed from the upper surfaces of the contact plugs 3b, as shown in FIG. 7. Parts of the deposition film 2c located on the side surfaces of the contact plugs 3b are larger in perpendicular thickness than those located on the upper surfaces of the contact plugs 3b, and hence the parts of the deposition film 2c located on the side surfaces of the contact plugs 3b cannot be completely removed by ion impacts. Thus, the deposition film 2c and the dummy interlayer dielectric film 2 partially remain on the side surfaces of the contact plugs 3b. The anisotropic etching shown in FIGS. 5 and 7 and deposition of fluorocarbon shown in FIG. 6 are simultaneously and continuously repeated, so that the side wall insulator films 2a consisting of the dummy interlayer dielectric film 2 and deposition films 2c of fluorocarbon are formed on both side surfaces of the contact plugs 3b, as shown in FIG. 8.

The deposition films 2c of fluorocarbon are removed by etching. Thus, only the side wall insulator films 2a are left on the side surfaces of the contact plugs 3b as shown in FIG. 9.

Figure 9:
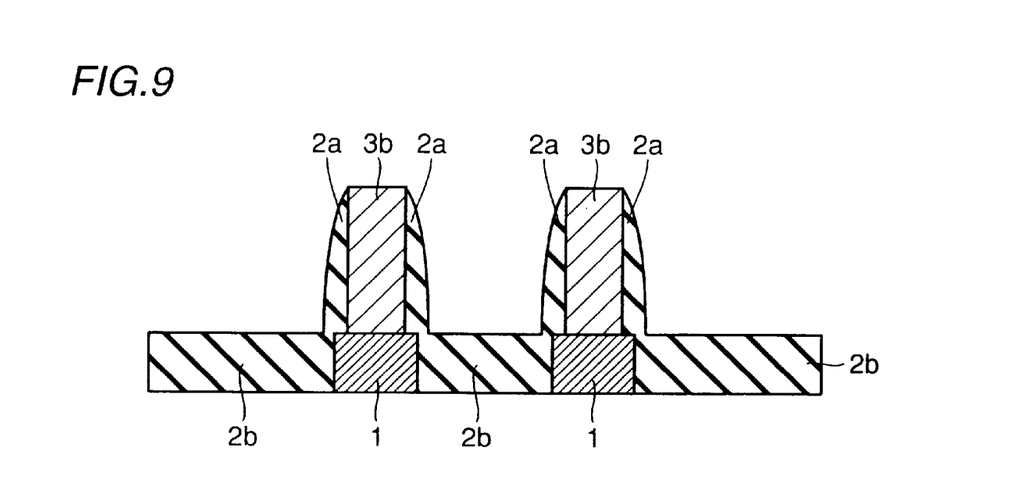

The end point of etching preferably stops on a vertical position flush with the upper surfaces of the lower wires 1 as shown in FIG. 9, to leave the insulator film 2b. However, the end point can be properly adjusted with a lower limit of completely removing the insulator film 2b and an upper limit on a position higher than the upper surfaces of the lower wires 1 by about 0.2 $\mu$m.

When etching the dummy interlayer dielectric film 2, the contact plugs 3b are hardly etched.

Figure 10:
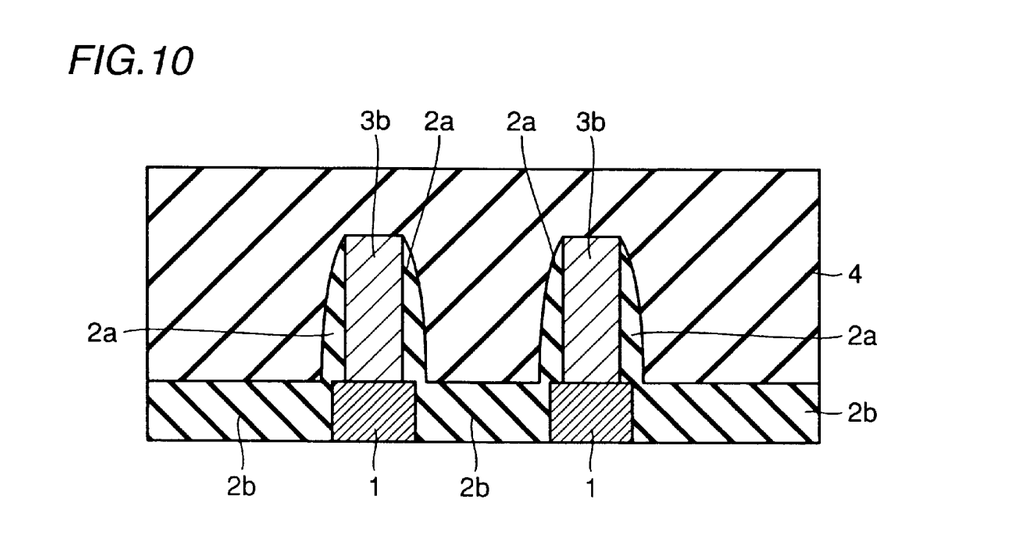

Step 5 (See FIG. 10)

The organic SOG film 4, which is a low dielectric constant insulator film containing at least 1 mass % of carbon, is formed by rotational coating or the like to cover the insulator film 2b, the side wall insulator films 2a and the contact plugs 3b. The term "low dielectric constant insulator film" indicates an insulator film exhibiting a dielectric constant lower than 3.9, the dielectric constant of a general thermal oxide film. For example, the dielectric constant of the organic SOG film 4 is about 2.8. The organic SOG film 4 is so controlled as to completely embed the contact plugs 3b therein without causing voids. According to this embodiment, the organic SOG film 4 is formed by rotational coating, so that the contact plugs 3b can be readily completely embedded therein without causing voids.

Figure 11:
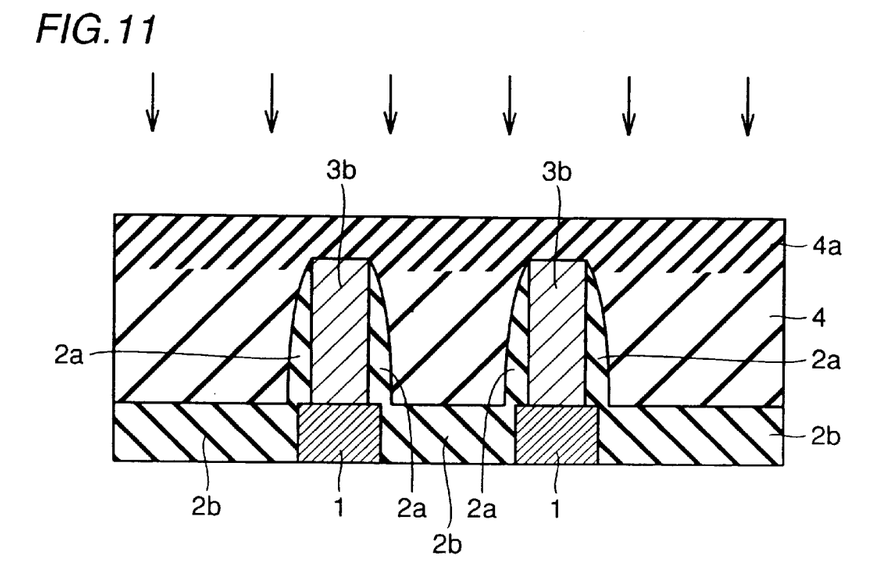

Step 6 (See FIG. 11)

Boron ions are implanted into the organic SOG film 4 under conditions of acceleration energy of at least 40 keV and an injection rate of at least $1\times10^{15}$ atoms/$cm^2$. Thus, the modified SOG film 4a containing no organic components and only small quantities of moisture and hydroxyl groups is formed on the surface of the organic SOG film 4.

Thus, the mechanical strength of the organic SOG film 4 can be improved by forming the modified SOG film 4a. Consequently, it is possible to effectively prevent a wafer crack resulting from a crack of the organic SOG film 4 caused when polishing the organic SOG film 4 by CMP in a next step.

Further, organic components are removed by forming the modified SOG film 4a, whereby the modified SOG film 4a is improved in wettability as compared with the organic SOG film 4. Consequently, it is possible to effectively prevent the surface of the organic SOG film 4 from scratches caused when polishing the organic SOG film 4 by CMP in the next step.

Figure 12:
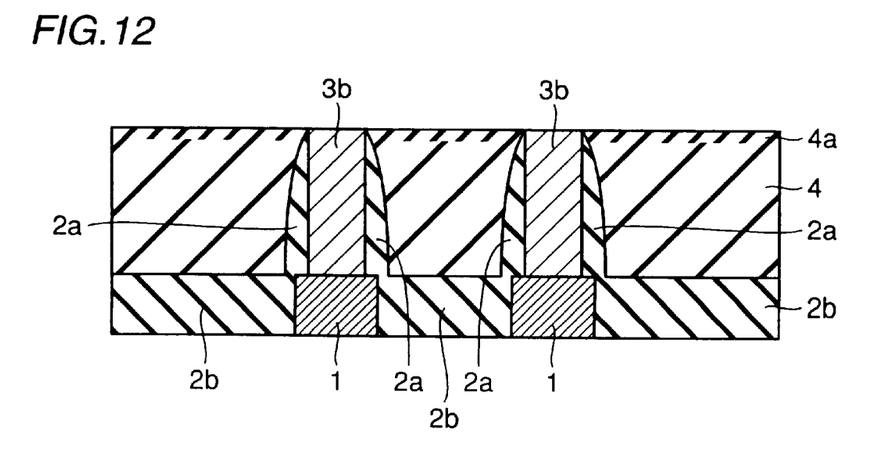

Step 7 (See FIG. 12)

The upper surface of the modified SOG film 4a is polished by CMP to expose the contact plugs 3b.

Figure 1:
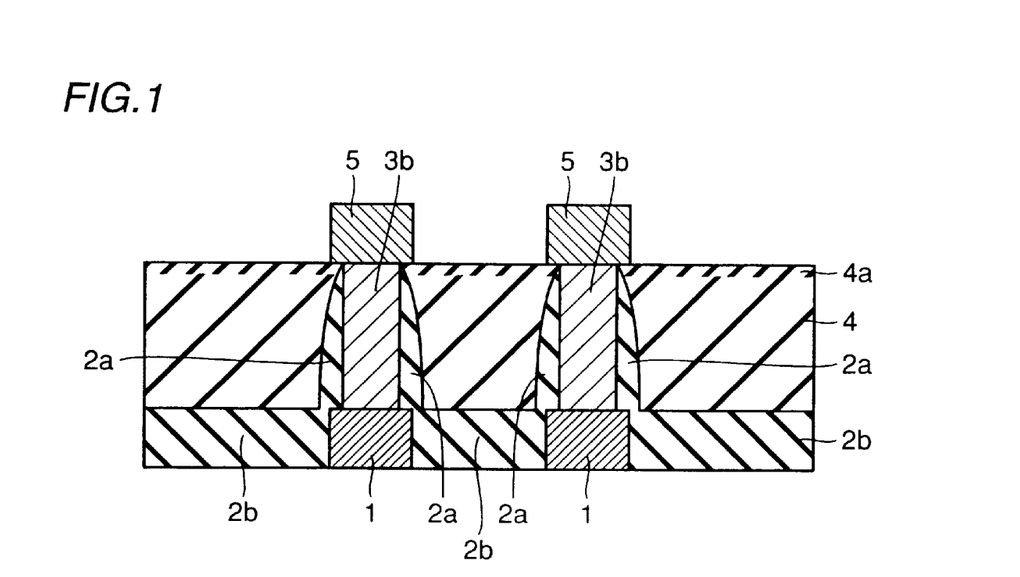
FIG. 1 is a schematic sectional view showing a semiconductor device according to a first embodiment of the present invention.

Step 8 (See FIG. 1)

A metal film is formed on the modified SOG film 4a and thereafter worked by photolithography and anisotropic etching, thereby forming the upper wires 5 shown in FIG. 1. Thus, the semiconductor device according to the first embodiment is formed.

In the fabrication process according to the first embodiment, the contact plugs 3b are formed through the dummy interlayer dielectric film 2 before forming the organic SOG film 4 serving as an interlayer dielectric film as hereinabove described, to require neither a step of performing etching for forming contact holes in the organic SOG film 4 nor a step of charging and embedding conductive members in the contact holes of the organic SOG film 4 dissimilarly to the conventional fabrication process. Consequently, the electric characteristics of contact parts can be improved also when preparing the interlayer dielectric film from a material hard to etch or a material discharging a large quantity of gas of moisture etc. when forming the contact plugs 3b.

According to the first embodiment, further, the organic SOG film 4 having a low dielectric constant is formed between the upper wires 1 and the lower wires 5, whereby parasitic capacitance between the upper wires 1 and the lower wires 5 can be reduced.

Second Embodiment

The structure of a semiconductor device according to a second embodiment of the present invention is now described with reference to FIG. 13. Elements of the second embodiment similar to those of the first embodiment are denoted by the same reference numerals, and redundant description is not repeated.

In the semiconductor device according to the second embodiment, lower groove wires 21 are embedded in wiring grooves formed in an insulator film (not shown). An organic SOG film 4 is formed on the lower groove wires 21 and the insulator film. A modified SOG film 4a modified by ion implantation is formed on the surface of the organic SOG film 4, similarly to the first embodiment. Wiring grooves 25a are formed in the organic SOG film 4 and the modified SOG film 4a. Upper groove wires 25b are embedded in the wiring grooves 25a. Contact plugs 3b embedded in the organic SOG film 4 connect the lower groove wires 21 and the upper groove wires 25b with each other. Side wall insulator films 2a are formed on the side surfaces of the contact plugs 3b connecting the lower groove wires 21 and the upper groove wires 25b with each other, similarly to the first embodiment.

In the second embodiment, the technique shown in the first embodiment is applied to a groove wiring process. The groove wiring process is a technique of not forming wires on an interlayer dielectric film but forming grooves in the interlayer dielectric film and embedding wires in the grooves. Steps of fabricating the semiconductor device according to the second embodiment are similar to those of the first embodiment except the groove wiring process.

The fabrication process for the semiconductor device according to the second embodiment is now described with reference to FIGS. 13 to 20.

Figure 14:
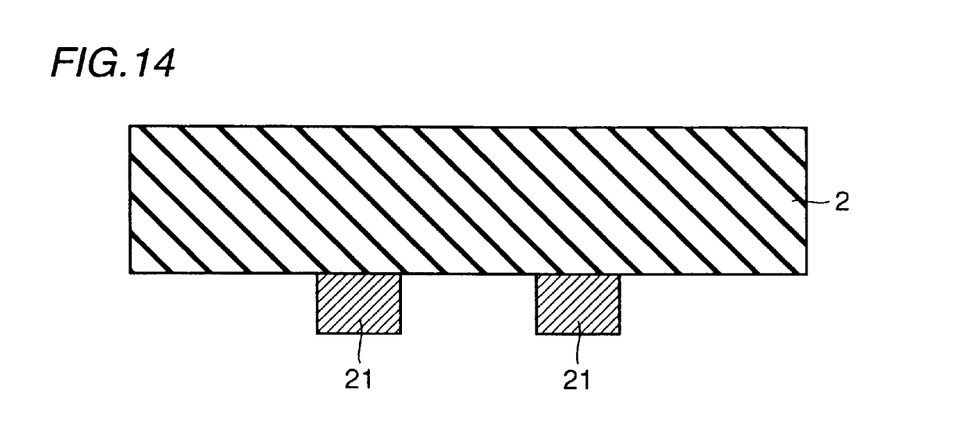
FIGS. 14 to 20 are schematic sectional views showing a multilevel interconnection forming process for the semiconductor device according to the second embodiment of the present invention.

Step 9 (See FIG. 14)

The wiring grooves are formed in the insulator film (not shown) and the lower groove wires 21 are thereafter formed in the wiring grooves. Thereafter a dummy interlayer dielectric film 2 is formed on the insulator film and the wiring grooves 21.

Figure 15:
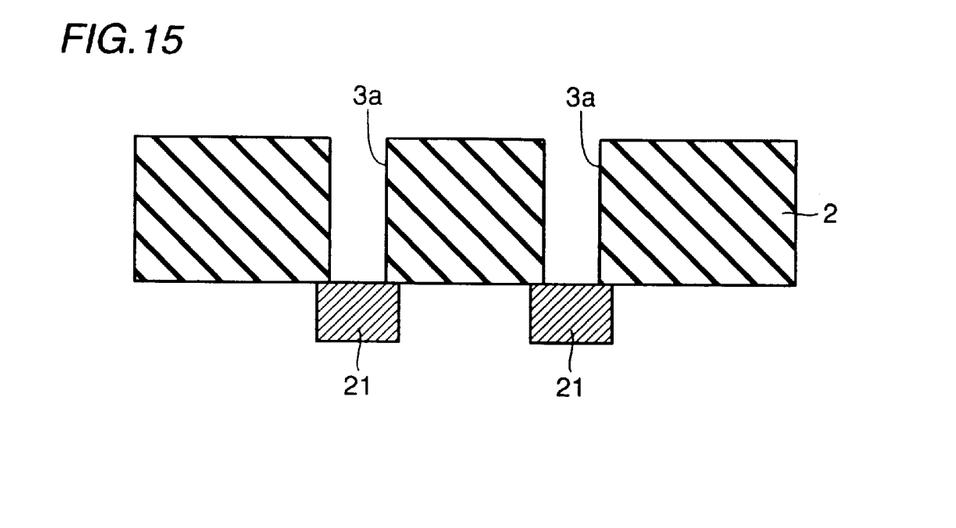

Step 10 (See FIG. 15)

Contact holes 3a are formed in the dummy interlayer dielectric film 2 by general photolithography and anisotropic etching.

Figure 16:
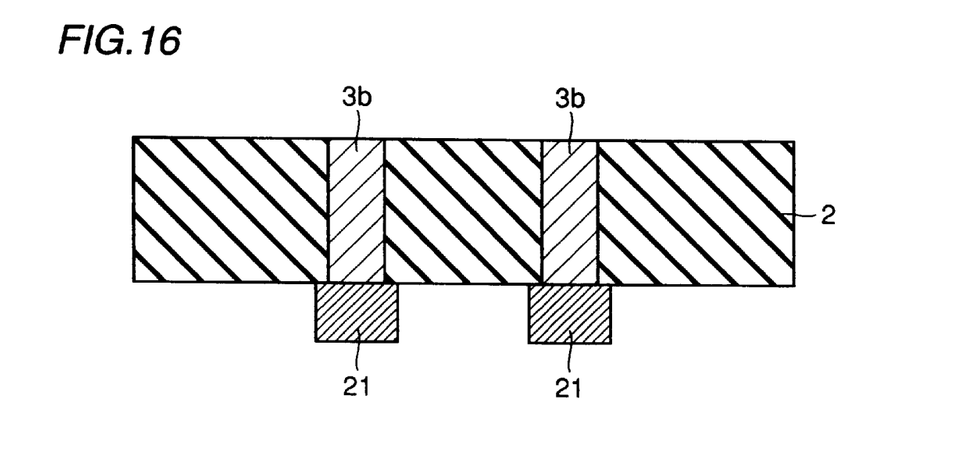

Step 11 (See FIG. 16)

The contact plugs 3b are formed in the contact holes 3a. A method of forming the contact plugs 3b is similar to that in the step 3of the first embodiment.

Figure 17:
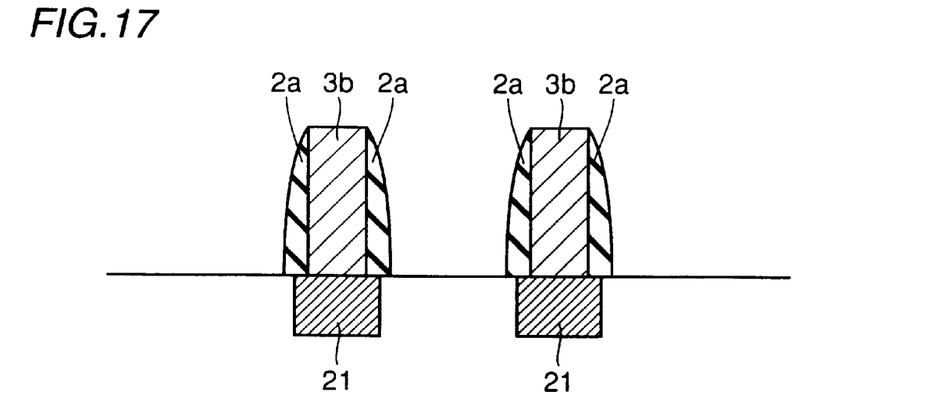

Step 12 (See FIG. 17)

Then, the dummy interlayer dielectric film 2 is etched by anisotropic etching through RIE, thereby forming the side wall insulator films 2a on the side surfaces of the contact plugs 3b. A method of forming the side wall insulator films 2a is similar to that in the step 4of the first embodiment.

The end point of etching preferably stops on a vertical position flush with the upper surfaces of the lower wires 21 as shown in FIG. 17, to leave the insulator film 2b. However, the end point can be properly adjusted with a lower limit of completely removing the insulator film 2b and an upper limit on a position higher than the upper surfaces of the lower wires 21 by about 0.2 $\mu$m.

Figure 18:
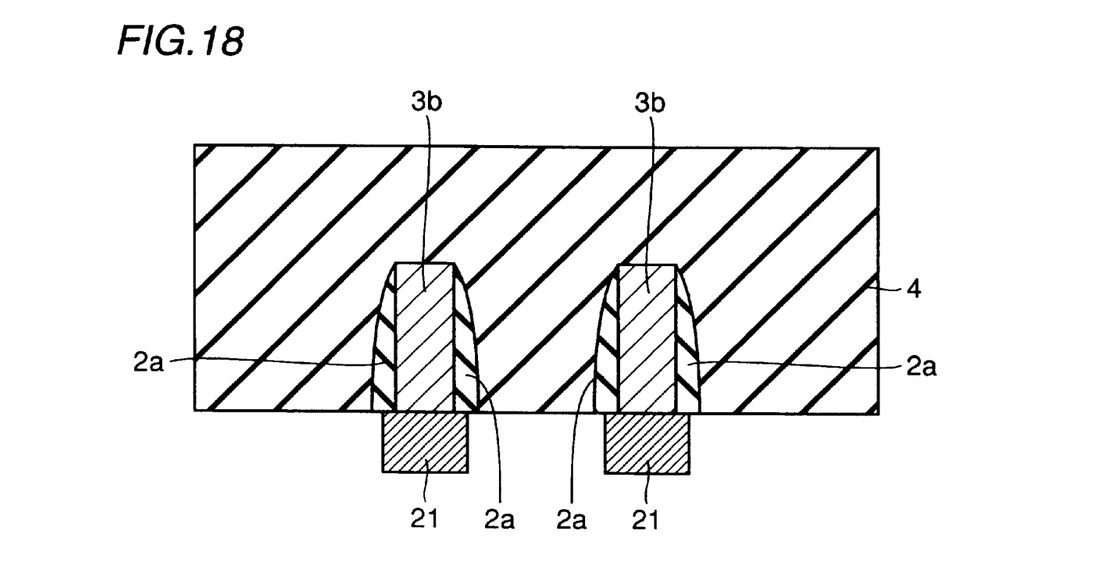

Step 13 (See FIG. 18)

The organic SOG film 4 of a low dielectric constant insulator film is formed by rotational coating or the like to cover the insulator film 2b, the side wall insulator films 2a and the contact plugs 3b.

Figure 19:
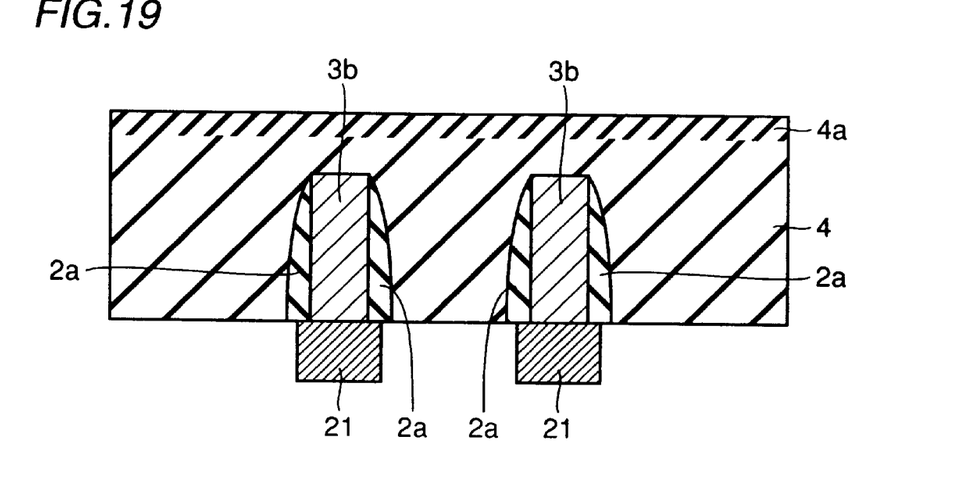

Step 14 (See FIG. 19)

Ion implantation is performed on the organic SOG film 4 thereby forming the modified SOG film 4a on its surface. Conditions for the ion implantation are similar to those in the step 6of the first embodiment. Thus, the modified SOG film 4a containing no organic components and only small quantities of moisture and hydroxyl groups is formed on the surface of the organic SOG film 4, similarly to the first embodiment. Consequently, it is possible to effectively prevent a wafer crack resulting from a crack of the organic SOG film 4 and scratches on the surface of the organic SOG film 4 when polishing the organic SOG film 4 by CMP in a next step, similarly to the first embodiment. Thereafter the surface of the modified SOG film 4a is flattened by CMP and polished from above the contact plugs 3b to leave a thickness corresponding to that of the upper groove wires 25b.

Figure 20:
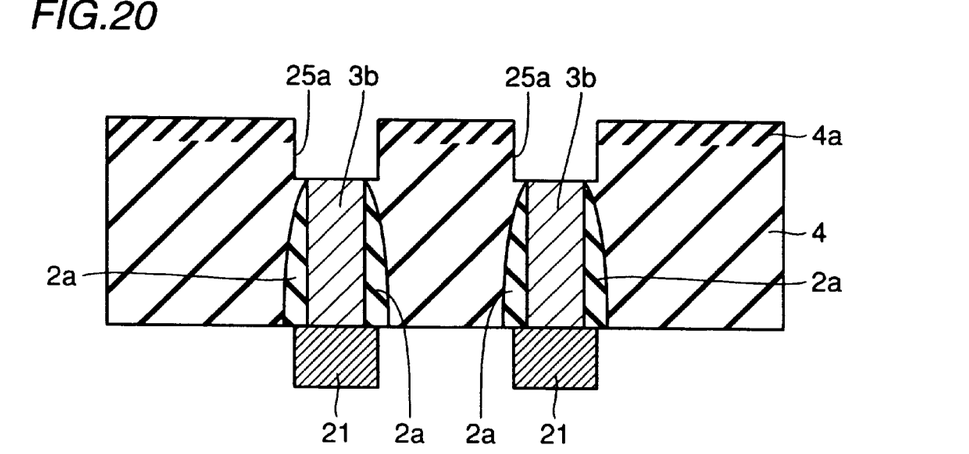

Step 15 (See FIG. 20)

The wiring grooves 25a are formed in the modified SOG film 4a and the organic SOG film 4 by photolithography and anisotropic etching.

Figure 13:
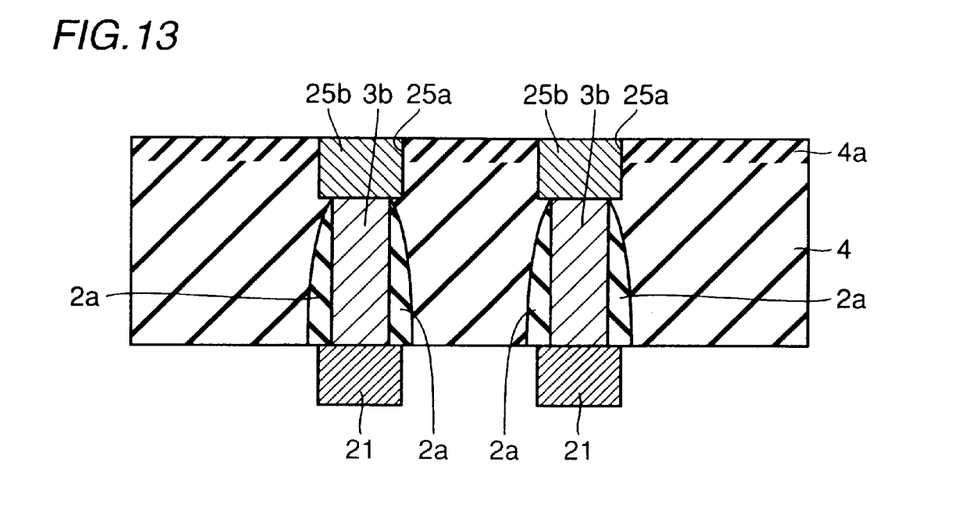
FIG. 13 is a schematic sectional view showing a semiconductor device according to a second embodiment of the present invention.

Step 16 (See FIG. 13)

A copper film is formed in the wiring grooves 25a and on the modified SOG film 4a by electroplating and thereafter polished by CMP to expose the modified SOG film 4a. Thus, the upper groove wires 25b of copper are formed in the wiring grooves 25a as shown in FIG. 13. Thus, the semiconductor device according to the second embodiment is formed.

According to the second embodiment, the lower groove wires 21 and the upper groove wires 25b are formed by CMP without etching, whereby a metal material such as copper hard to etch can be employed. Consequently, wiring resistance can be reduced by employing a low-resistance material such as copper.

Third Embodiment

Figure 21:
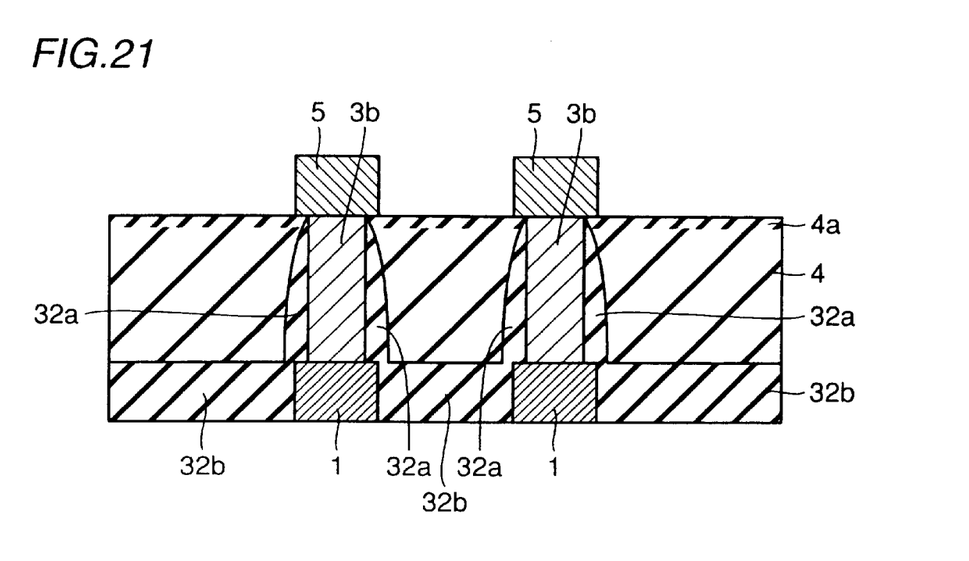
FIG. 21 is a schematic sectional view showing a semiconductor device according to a third embodiment of the present invention.

The structure of a semiconductor device according to a third embodiment of the present invention is now described with reference to FIG. 21. According to the third embodiment, side wall insulator films 32a are formed by BPSG films which are silicon oxide films containing boron and phosphorus added thereto in a structure similar to that of the first embodiment. In the process of the third embodiment, a BPSG film is employed as a dummy interlayer dielectric film 32, dissimilarly to the process of the first embodiment. The remaining structure of the third embodiment is similar to that of the first embodiment. The third embodiment is now described in detail.

In the semiconductor device according to the third embodiment, an insulator film 32b of a BPSG film is formed between adjacent lower wires 1. An organic SOG film 4 is formed on the lower wires 1 and the insulator film 32b, similarly to the first embodiment. A modified SOG film 4a modified by ion implantation is formed on the surface of the organic SOG film 4. Upper wires 5 are formed on the modified SOG film 4a. The side wall insulator films 32a of BPSG films are formed on the side surfaces of contact plugs 3b connecting the lower wires 1 and the upper wires 5 with each other. The side wall insulator films 32a of BPSG films can also prevent moisture and hydroxyl groups contained in the organic SOG film 4 from penetrating into the contact plugs 3b. Consequently, the electric characteristics of contact parts can be kept excellent.

The fabrication process for the semiconductor device according to the third embodiment is now described with reference to FIGS. 22 to 25.

Figure 22:
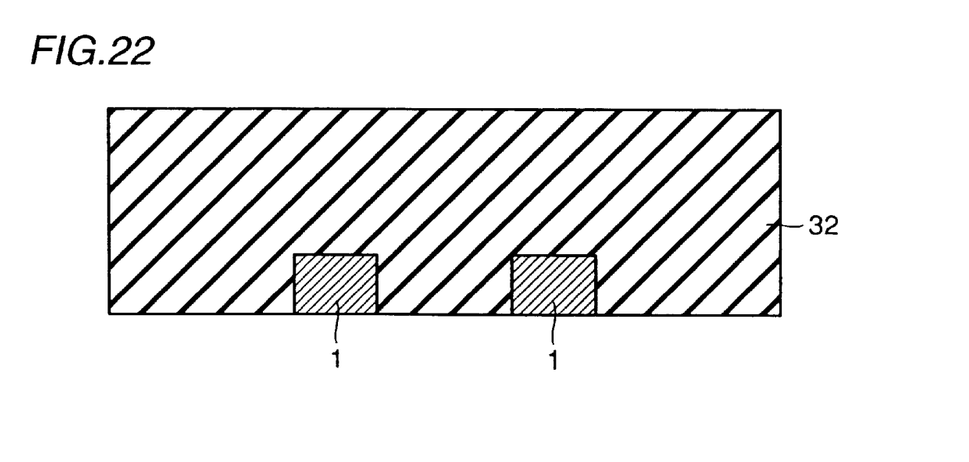
FIGS. 22 to 25 are schematic sectional views showing a multilevel interconnection forming process for the semiconductor device according to the third embodiment of the present invention.

Step 17 (See FIG. 22)

The dummy interlayer dielectric film 32 of a BPSG (borophosphosilicate glass) film is formed by plasma CVD to cover the lower wires 1. The BPSG film is a silicon oxide film containing oxides of boron (B) and phosphorus (P) added thereto. This BPSG film is formed under conditions of gas of TEOS, oxygen, TMP (trimethyl phosphite: P(OCH$_3$)$_3$) and TMB (trimethyl borate: B(OCH$_3$)$_3$), a TEOS gas flow rate of 500 sccm, an O$_2$ gas flow rate of 700 sccm, a TMP gas flow rate of 35 sccm, a TMB gas flow rate of 100 sccm, a temperature of 430° C., a pressure of 800 Pa and an RF output (13.56 MHz) of 155 W. Then, the formed dummy interlayer dielectric film 32 is flattened by CMP.

Figure 23:
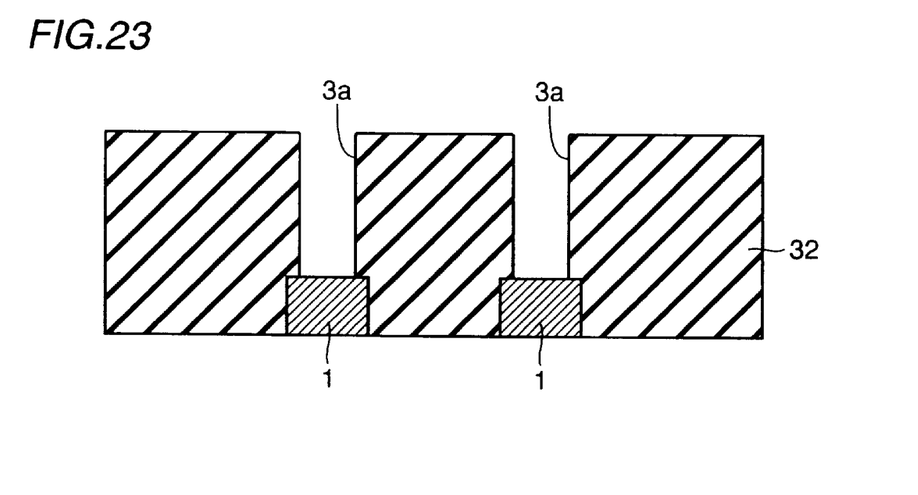

Step 18 (See FIG. 23)

Contact holes 3a are formed in the dummy interlayer dielectric film 32 by general photolithography and anisotropic etching.

Figure 24:
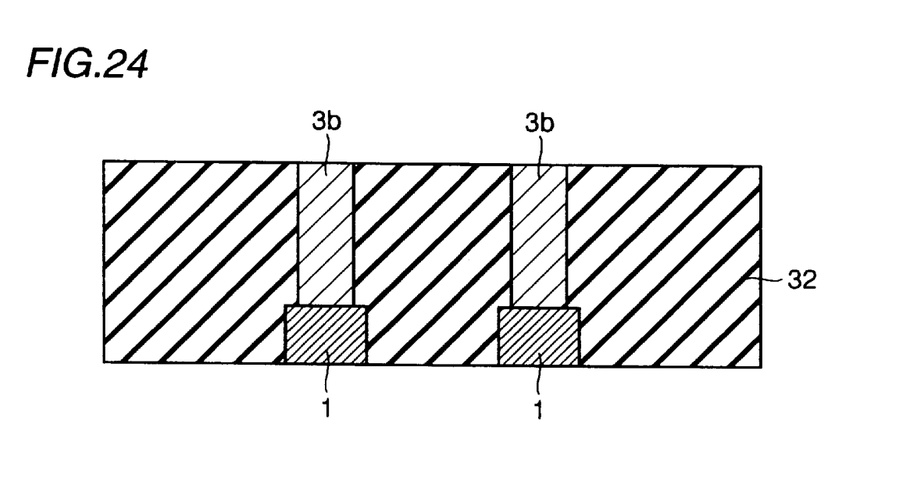

Step 19 (See FIG. 24)

Films of titanium (Ti), titanium nitride (TiN) and tungsten (W) are successively formed in the contact holes 3a and on the dummy interlayer dielectric film 32 by sputtering, CVD and blanket tungsten CVD respectively. An excessive deposited portion located on the dummy interlayer dielectric film 32 is polished by CMP to expose the dummy interlayer dielectric film 32. Thus, contact plugs 3b are formed in the contact holes 3a.

Figure 25:
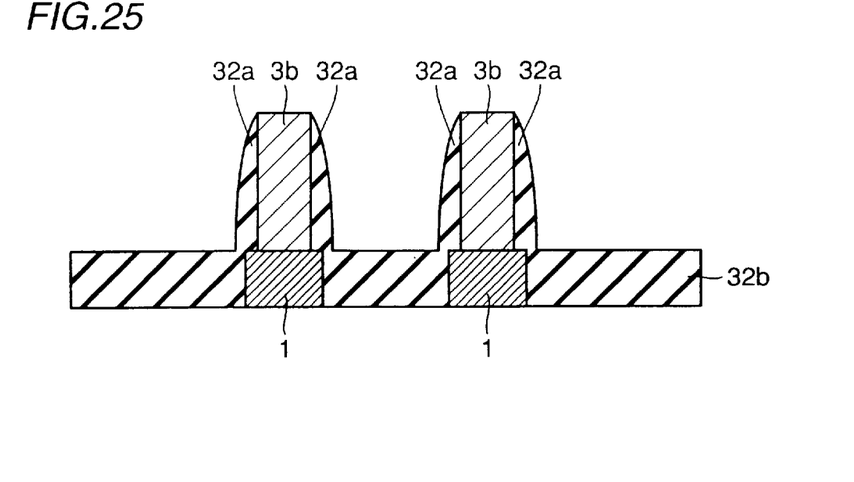

Step 20(See FIG. 25)

The dummy interlayer dielectric film 32 is etched by anisotropic etching through RIE similarly to the step 4 of the first embodiment, thereby forming the side wall insulator films 32a of BPSG films on the side surfaces of the contact plugs 3b while forming the insulator film 32b of a BPSG film.

Steps subsequent to the step 20 are similar to the steps 5 to 8 of the first embodiment, and hence redundant description is not repeated.

According to the third embodiment, the parts other than the dummy interlayer dielectric film 32 are rendered similar in structure to those of the first embodiment as described above, thereby attaining functions/effects similar to those of the first embodiment.

According to the third embodiment, further, the BPSG film is employed as the dummy interlayer dielectric film 32 dissimilarly to the first embodiment, whereby the etching rate for the dummy interlayer dielectric film 32 for forming the side wall insulator films 32a can be remarkably improved as compared with that in the case of employing the NSG film in the first embodiment. Therefore, the etching time for forming the side wall insulator films 32a can be reduced. Further, the amount of etching of the upper surfaces of the contact plugs 3b can be reduced due to such reduction of the etching time. Consequently, the electric characteristics of the contact plugs 3b can be kept excellent.

Although the present invention has been described and illustrated in detail, it is clearly understood that the same is by way of illustration and example only and is not to be taken by way of limitation, the spirit and scope of the present invention being limited only by the terms of the appended claims.

(1) While the silicon oxide film or the BPSG film formed by plasma CVD is employed as the dummy interlayer dielectric film in each of the aforementioned embodiments, the present invention is not restricted to this but a silicon oxide film or a silicon nitride film formed by high-density plasma CVD or a combination of such films may be employed.

According to the high-density plasma CVD, the silicon oxide film is formed under conditions of gas of monosilane (SiH$_4$), oxygen and argon, a monosilane gas flow rate of 80 sccm, an O$_2$ gas flow rate of 120 sccm, an Ar gas flow rate of 50 sccm, a temperature of 350° C., a pressure of 0.3 Pa and RF outputs of 1800 W (13.56 MHz) and 2800 W (450 kHz). The silicon nitride film is formed under conditions of gas of monosilane, nitrogen (N$_2$) and ammonia (NH$_3$), a monosilane gas flow rate of 150 sccm, a nitrogen gas flow rate of 1500 sccm, an ammonia gas flow rate of 50 sccm, a temperature of 360° C., a pressure of 670 Pa and an RF output (13.56 MHz) of 420 W.

(2) As the material for the contact plugs 3b, copper or aluminum may be employed in place of tungsten and tantalum nitride (TaN) or tungsten nitride (WN) may be employed in place of titanium nitride (TiN), while titanium may be omitted.

(3) Not only the organic SOG film 4 but also an organic polymer-based film (e.g. PAE (polyarylene ether)), an inorganic SOG film (e.g., HSQ (hydrogen silsequixanes)) or a porous film (e.g., silica gel) of such a film may be employed as the low dielectric constant insulator film.

(4) The step of modifying the organic SOG film 4 by ion implantation may be omitted.

(5) As the material for the groove wires 5b in the second embodiment, silver or aluminum may be employed in place of copper.

(6) While the BPSG film is formed by plasma CVD in the third embodiment, the present invention is not restricted to this but the BPSG film can be similarly formed also by atmospheric pressure CVD. Further, the TEOS gas employed in plasma CVD may be replaced with monosilane gas.

What is claimed is:

1. A semiconductor device comprising:

an interlayer dielectric film;

a conductive member embedded in said interlayer dielectric film; and a silicon oxide sidewall insulator film formed on the side surface of said conductive member, wherein
said interlayer dielectric film is formed between a first conductive layer and a second conductive layer, and
said first conductive layer and said second conductive layer are electrically connected with each other through said conductive member embedded in said interlayer dielectric film.

2. The semiconductor device according to claim 1, wherein said silicon oxide film includes a silicon oxide film containing phosphorus and boron added thereto.

3. The semiconductor device according to claim 1, wherein said interlayer dielectric film includes an SOG film.

4. The semiconductor device according to claim 1, wherein said interlayer dielectric film includes a coating film containing at least 1 mass % of carbon.

5. The semiconductor device according to claim 1, wherein an impurity is introduced into the surface of said interlayer dielectric film.

6. The semiconductor device according to claim 1, wherein said second conductive layer is formed on the upper surface of said interlayer dielectric film to be in contact with said conductive member.

7. The semiconductor device according to claim 1, wherein said interlayer dielectric film includes a wiring groove formed on the upper portion of said conductive member, and
said second conductive layer is embedded in said wiring groove to be in contact with said conductive member.

* * * * *